United States Patent
Lee et al.

(10) Patent No.: US 12,317,515 B2
(45) Date of Patent: May 27, 2025

(54) MEMORY DEVICE AND SEMICONDUCTOR DIE HAVING THE MEMORY DEVICE

(71) Applicant: Taiwan Semiconductor Manufacturing Company, Ltd., Hsinchu (TW)

(72) Inventors: Tung-Ying Lee, Hsinchu (TW); Shao-Ming Yu, Hsinchu County (TW); Win-San Khwa, Taipei (TW); Yu-Chao Lin, Hsinchu (TW); Chien-Hsing Lee, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 499 days.

(21) Appl. No.: 17/880,677

(22) Filed: Aug. 4, 2022

(65) Prior Publication Data
US 2024/0049477 A1    Feb. 8, 2024

(51) Int. Cl.
*H10B 63/00*   (2023.01)
*H10B 63/10*   (2023.01)
*H10N 70/00*   (2023.01)
*H10N 70/20*   (2023.01)

(52) U.S. Cl.
CPC ............. *H10B 63/80* (2023.02); *H10B 63/30* (2023.02); *H10N 70/063* (2023.02); *H10N 70/231* (2023.02); *H10N 70/8413* (2023.02)

(58) Field of Classification Search
CPC ........ H10B 63/80; H10B 63/30; H10B 63/10; H10B 63/24; H10N 70/063; H10N 70/231; H10N 70/8413; H10N 70/826; H10N 70/8828
See application file for complete search history.

(56) References Cited

U.S. PATENT DOCUMENTS 9,111,612 B2 *   8/2015   Linstadt ............. G11C 13/0035
2014/0071747 A1 *   3/2014   Jurasek .............. G11C 13/0069
                                                                  365/163

* cited by examiner

*Primary Examiner* — David Vu
(74) *Attorney, Agent, or Firm* — JCIPRNET

(57) ABSTRACT

A memory device and a semiconductor die are provided. The memory device includes single-level-cells (SLCs) and multi-level-cells (MLCs). Each of the SLCs and the MLCs includes: a phase change layer; and a first electrode, in contact with the phase change layer, and configured to provide joule heat to the phase change layer during a programming operation. The first electrode in each of the MLCs is greater in footprint area as compared to the first electrode in each of the SLCs.

20 Claims, 16 Drawing Sheets

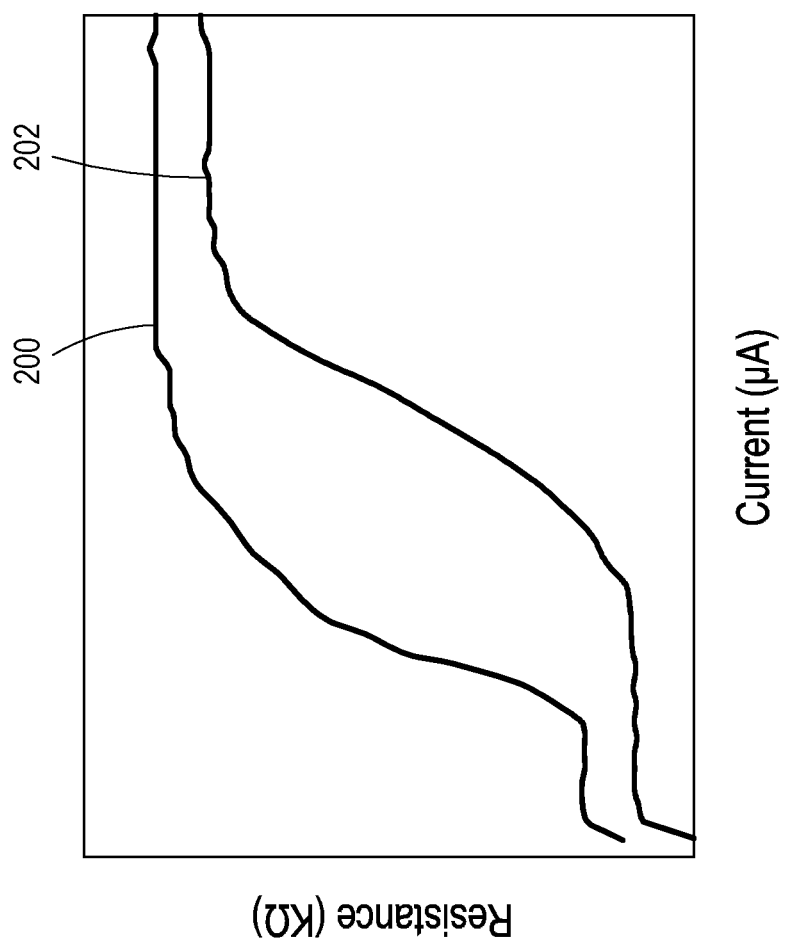

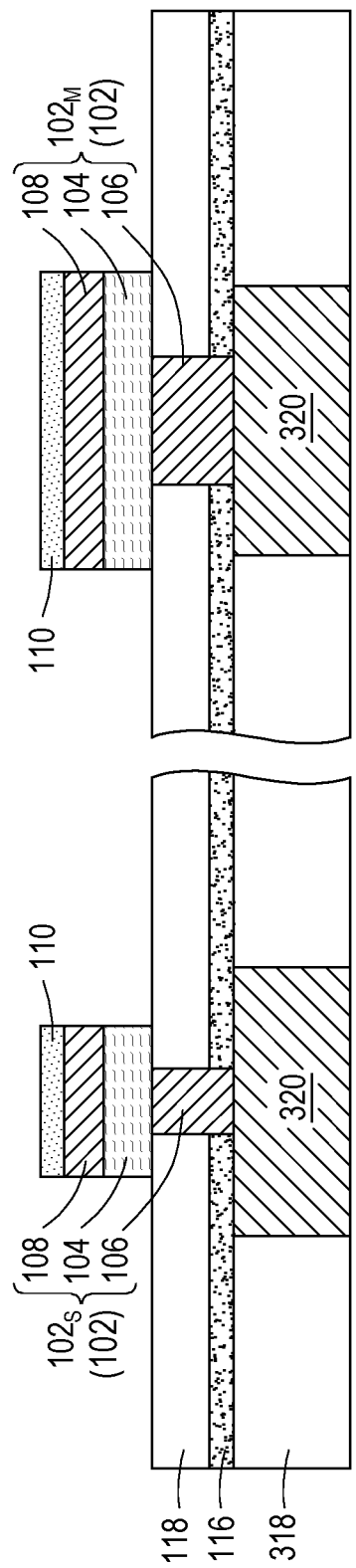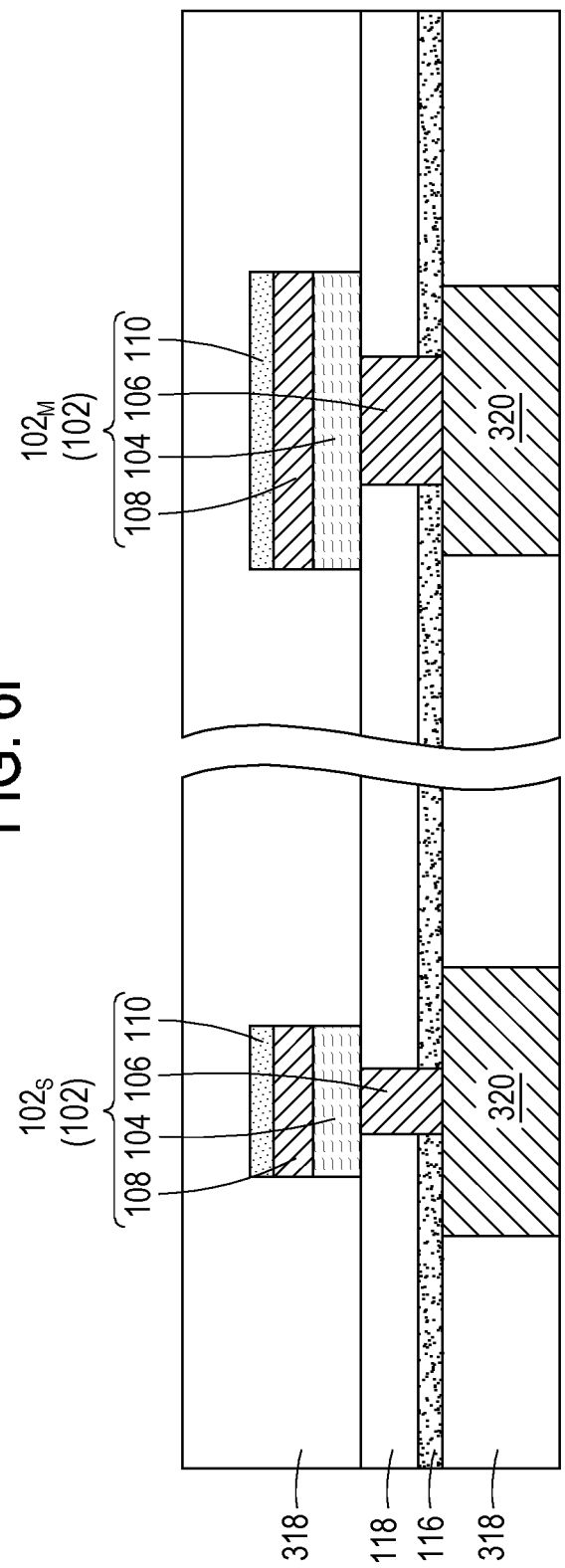

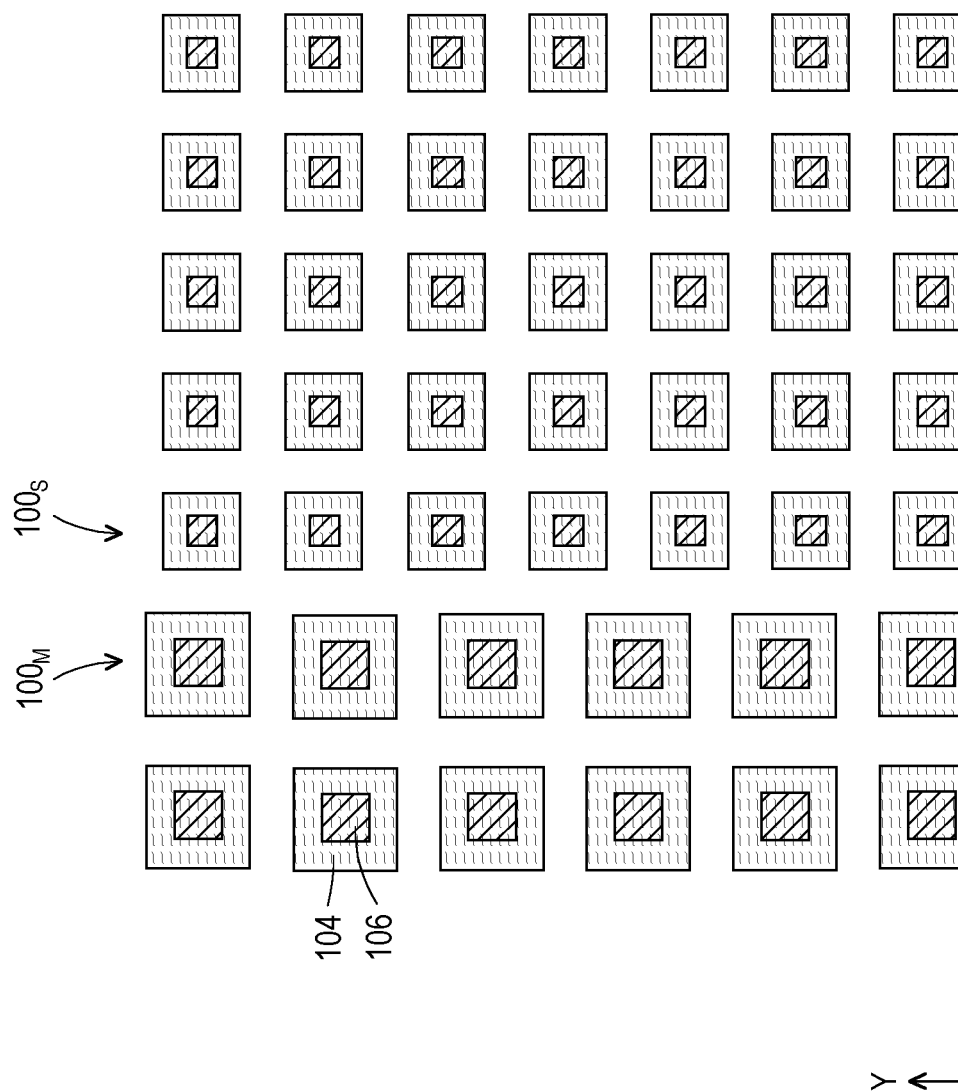

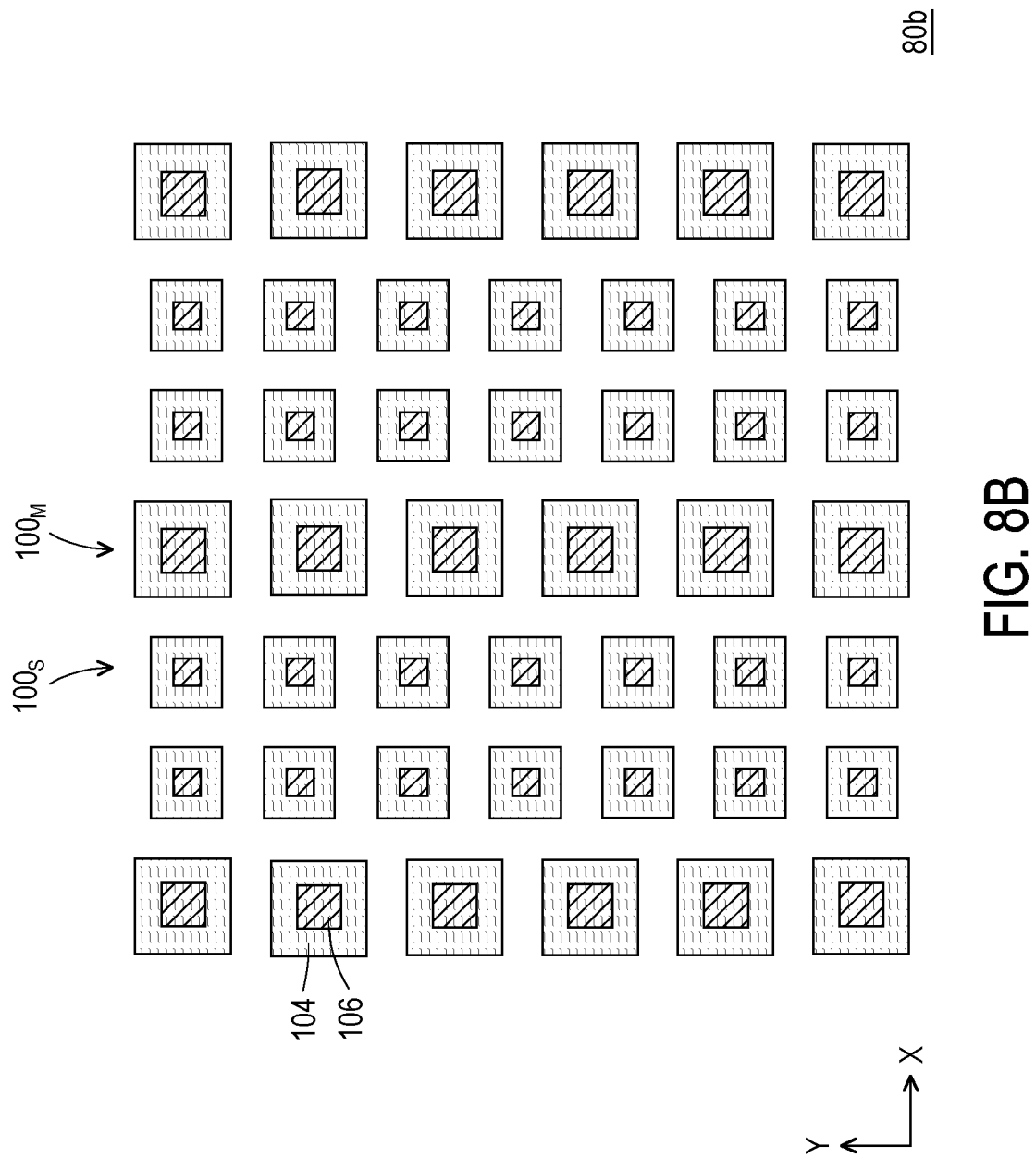

MEMORY DEVICE AND SEMICONDUCTOR DIE HAVING THE MEMORY DEVICE

BACKGROUND

Data has become the most competitive resource in recent decades. Particularly, with advent of big-data era and artificial intelligence, a massive amount of data needs to be processed and saved. In order to further enhance memory density of a memory array, a multi-level-cell (MLC) approach has been developed. As compared to a single-level-cell (SLC), a MLC can store more than a single bit of information. However, as a result of smaller margin of error, MLCs may have a higher bit error rate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 is a plot diagram showing switching behaviors (presented by mean values) of the phase change layers in the SLCs and the MLCs.

FIG. 6A through FIG. 6H are schematic cross-sectional views illustrating intermediate structures at various stages during the process as shown in FIG. 5.

FIG. 8A, FIG. 8B, FIG. 9A and FIG. 9B are respectively a schematic plan view illustrating phase change layers and bottom electrodes in SLCs and MLCs of a memory device, according to some embodiments of the present disclosure.

DETAILED DESCRIPTION

Figure 1A:
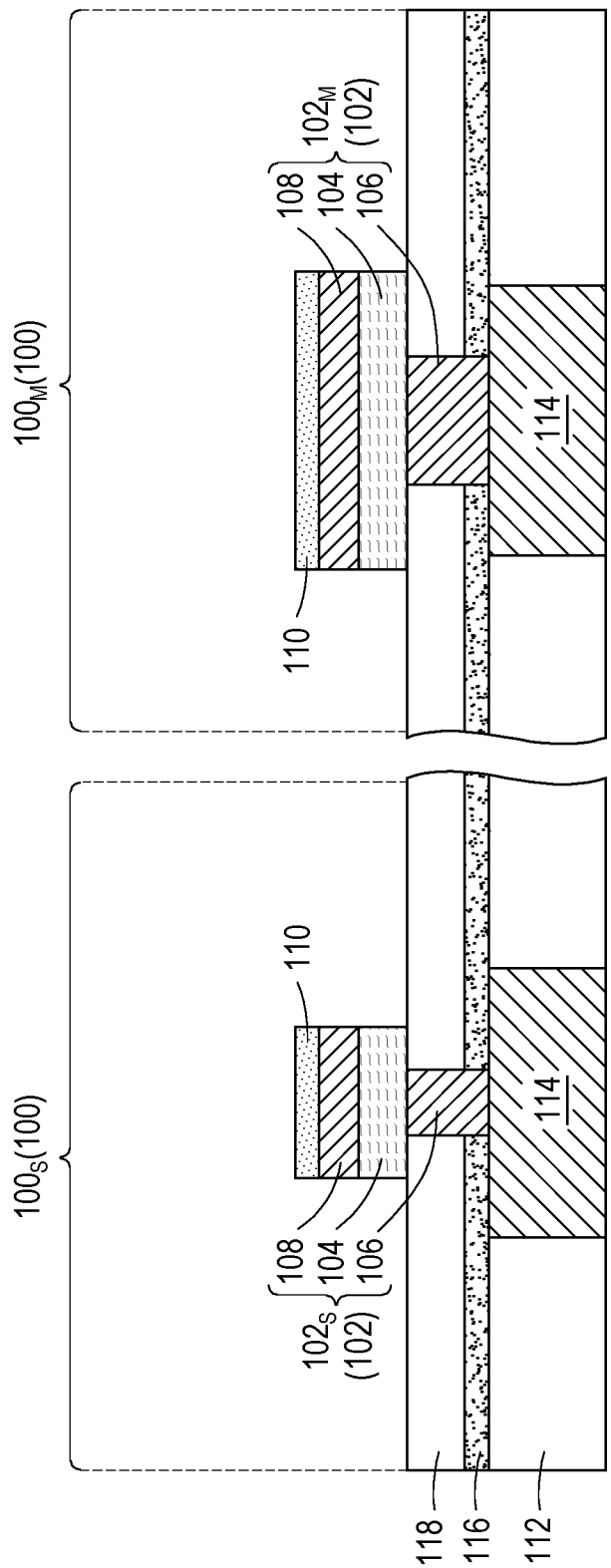
FIG. 1A is a schematic cross-sectional view illustrating storage devices in different memory cells in a memory device, according to some embodiments of the present disclosure.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A memory device including both of single-level-cells (SLCs) and multi-level-cells (MLCs) is provided. As a result of such hybrid design, the memory device can be benefited from high memory density while still having availability for storing data with low fault tolerance (e.g., data assigned with high weighting). Further, the SLCs and the MLCs are different in terms of dimensions, such that power for programming the SLCs can be reduced, and bit error rate of the MLCs can be lowered.

FIG. 1A is a schematic cross-sectional view illustrating storage devices in different memory cells in a memory device 10, according to some embodiments of the present disclosure.

Referring to FIG. 1A, in some embodiments, the memory device 10 is a phase change random access memory (PCRAM). In these embodiments, a storage device 102 in each cell 100 of the memory device 10 includes a phase change layer 104 and a pair of electrodes 106, 108 at opposite sides of the phase change layer 104. In some embodiments, the storage device 102 in each cell 100 is further covered by a hard mask layer 110. Crystallinity of the phase change layer 104 may be altered by joule heating provided by the electrode 106 in contact with the phase change layer 104. The phase change layer 104 may have a relatively high electrical resistance while having relatively low crystallinity. On the other hand, the phase change layer 104 may have a relatively low electrical resistance while having a relatively high crystallinity. In addition, by controlling voltage difference between the electrodes 106, 108 (i.e., changing current flowing through the electrode 106), crystallinity of the phase change layer 104 may vary by two or more levels. Accordingly, the phase change layer 104 in each cell 100 may have a low resistance state and a high resistance state, or have a low resistance state, a high resistance state and at least one intermediate resistance state lying between the low resistance state and the high resistance state. Different resistance states of the phase change layer 104 are indicative of different data bits. The memory cell 100 having the phase change layer 104 switched between the low and high resistance states is referred to as a single-level cell (SLC) 100s, and is configured to store a single bit of information. On the other hand, the memory cell 100 including the storage device 102 having the phase change layer 104 switched between among the low resistance state, the at least one intermediate resistance state and the high resistance state is referred to as a multi-level cell (MLC) $100_M$, and is capable of storing multiple bits of information. In addition, the storage device 102 in the SLC $100_S$ is referred to as a storage device $102_S$, whereas the storage device 102 in the MLC $100_M$ is referred to as a storage device $102_M$.

Since each MLC $100_M$ is capable of storing multiple bits of information, a memory density of the memory device 10 having a plurality of the MLCs $100_M$ can be increased. As compared to the MLC $100_M$, the SLC $100_S$ may have a lower bit error rate, thus can be used for storing data with a low level of fault tolerance (e.g., the data assigned with high weighting). Therefore, the memory device 10 including both of the MLCs $100_M$ and the SLCs $100_S$ can have a high memory density, while being capable of storing data demanding high accuracy.

Figure 1B:
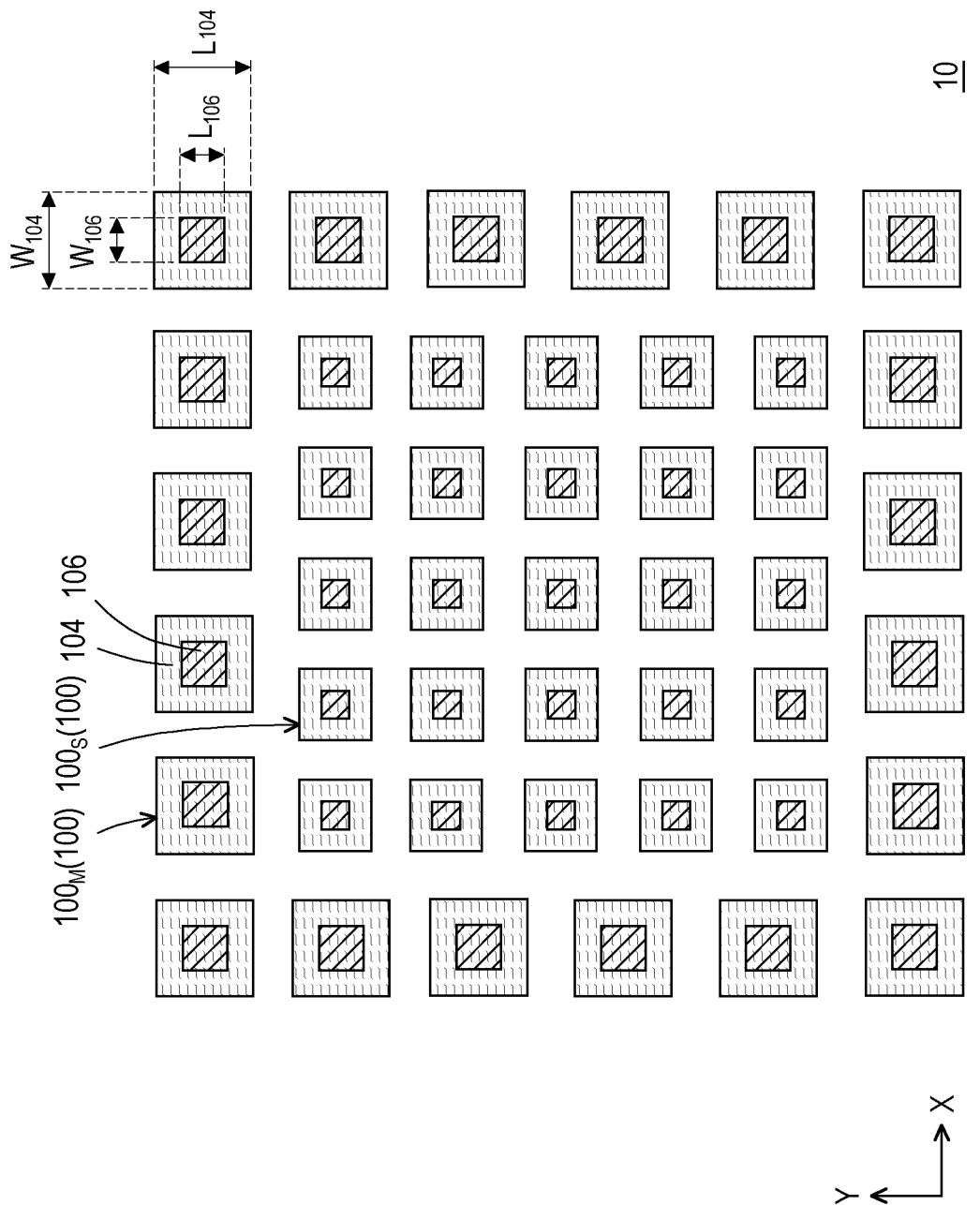
FIG. 1B is a schematic plan view illustrating phase change layers and bottom electrodes in single-level-cells (SLCs) and multi-level-cells (MLCs) of the memory device as shown in FIG. 1A, according to some embodiments of the present disclosure.

In some embodiments, the phase change layers 104 are formed of a chalcogenide material. The chalcogenide material includes one or more chalcogenide elements, such as Te and Sb. For instance, the chalcogenide material may be GeSbTe, such as $Ge_2Sb_2Te_5$ (GST225), $Ge_4Sb_2Te_4$ (GST424), $Ge_4Sb_6Te_7$ (GST467) or the like. As other examples, the chalcogenide material may include $Ti_{0.4}Sb_2Te_3$, supper lattice $Sb_2Te_3/TiTe_2$, supper lattice $GeTe/Sb_2Te_3$, supper lattice $Ti_2Te/Sb_2Te_3$ or so forth. In certain cases, the chalcogenide material may be doped with N, C, Si, C, In, Sn, Ga, As, Se or the like. In addition, in some embodiments, the electrodes 106 as joule heaters are formed of a conductive material having a relatively low conductivity for generating more thermal energy, titanium nitride may be an example for such conductive material. Further, in some embodiments, the electrodes 108 are formed of a conductive material with a relatively high conductivity. For instance, the electrodes 108 may be formed of Al, Cu, AlCu, W or one of other metallic materials. In those embodiments where the electrodes 108 are covered by the hard mask layers 110, an insulating material such as silicon oxide, silicon nitride, silicon oxynitride, silicon carbide, or the like can be used for forming the hard mask layers 110. FIG. 1B is a schematic plan view illustrating the phase change layers 106 and the electrodes 106 in the SLCs $100_S$ and the MLCs $100_M$ of the memory device 10, according to some embodiments of the present disclosure.

In addition to difference in data storage amount, the SLCs $100_S$ and the MLCs $100_M$ may be further different in terms of dimensions. Particularly, a difference between the SLCs $100_S$ and the MLCs $100_M$ lies in that the electrode 106 as a joule heater in each SLC $100_S$ is smaller in footprint area as compared to the electrode 106 as a joule heater in each MLC $100_M$. A smaller electrode 106 may have a greater resistance, thus may produce more joule heat. As a result of receiving different thermal energy, switching behavior of the phase change layers 104 in the SLCs 100s may be different from switching behavior of the phase change layers 104 in the MLCs $100_M$. FIG. 2 is a plot diagram showing switching behaviors (presented by mean values) of the phase change layers in the SLCs $100_S$ and the MLCs $100_M$.

A horizontal axis of the plot diagram shown in FIG. 2 indicates current provided to the electrodes 106 of the SLC $100_S$ and the MLC $100_M$, whereas a vertical axis of the plot diagram indicates resistance variation of the phase change layers 104 in the SLC $100_S$ and the MLC $100_M$, with respect to the sweeping current provided to the electrodes 106. A data curve 200 shows the switching behavior of the phase change layer 104 in the SLC $100_S$, and a data curve 202 shows the switching behavior of the phase change layer 104 in the MLC $100_M$. As indicated by the data curves 200, 202, the phase change layer 104 in the SLC $100_S$ can be switched to a high resistance state by a much smaller current, which indicates that a smaller power is required for programming (resetting) the SLC $100_S$. In addition, the phase change layer 104 in the SLC $100_S$ exhibits a sharp transition between a low resistance state and a high resistance state. On the other hand, the phase change layer 104 in the MLC $100_M$ exhibits a relatively smooth transition between a low resistance state and a high resistance state, which can be suggested by a ramp portion of the data curve 202. As a consequence, each intermediate resistance state of the phase change layer 104 in the MLC $100_M$, which is defined as a section of the ramp portion of the data curve 202, corresponds to a wider range of input current. In other words, each intermediate resistance state of the phase change layer 104 in the MLC $100_M$ can have a greater tolerance in terms of programming current, and thus can be more accurately programmed.

Referring to FIG. 1B again, in some embodiments, a ratio of a footprint area of the electrode 106 in each MLC $100_M$ over a footprint area of the electrode 106 in each SLC $100_S$ ranges from about 1.5 to about 10. Each electrode 106 may have a width $W_{106}$ along a direction X, and have a length $L_{106}$ along a direction Y intersected with the direction X. In some embodiments, a ratio of the width $W_{106}$ of the electrode 106 in each MLC $100_M$ with respect to the width $W_{106}$ of the electrode 106 in each SLC $100_S$ ranges from about 1.25 to about 3. Similarly, a ratio of the length $L_{106}$ of the electrode 106 in each MLC $100_M$ over the length $L_{106}$ of the electrode 106 in each SLC $100_S$ may range from about 1.25 to about 3. It should be understood that, although the electrodes 106 are depicted as rectangular patterns with orthogonal edges, the electrodes 106 may be alternatively formed as rectangular patterns with rounded edges, other polygon patterns with orthogonal/rounded edges or circular patterns. The present disclosure is not limited to a shape of each electrode 106.

In order to increase overlay budget, each MCL $100_M$ having a larger electrode 106 may also have a larger phase change layer 104. That is, a footprint area of the phase change layer 104 in each MLC $100_M$ may be greater than a footprint area of the phase change layer 104 in each SLC $100_S$. In some embodiments, a ratio of the footprint area of the phase change layer 104 in each MLC $100_M$ with respect to the footprint area of the phase change layer 104 in each SLC 100S may be greater than 1, and less than or equal to about 10. Each phase change layer 104 may have a width $W_{104}$ along the direction X, and have a length $L_{104}$ along the direction Y. In some embodiments, a ratio of the width $W_{104}$ of the phase change layer 104 in each MLC $100_M$ with respect to the width $W_{104}$ of the phase change layer 104 in each SLC $100_S$ is greater than 1, and less than or equal to about 3. Similarly, a ratio of the length $L_{104}$ of the phase change layer 104 in each MLC $100_M$ with respect to the length $L_{104}$ of the phase change layer 104 in each SLC $100_S$ may be greater than 1, and less than or equal to about 3. It should be also understood that, although the phage change layers 104 are depicted as rectangular patterns with orthogonal edges, the phase change layers 104 may be alternatively formed as rectangular patterns with rounded edges, other polygon patterns with orthogonal/rounded edges or circular patterns. The present disclosure is not limited to a shape of each phase change layer 104. Furthermore, although not shown in FIG. 1B, the electrodes 108 and the hard mask layers 110 (shown in FIG. 1A) covering the phase change layers 104 may be substantially identical with the phase change layers 104 in terms of footprint area, length, width and shape. That is, in those embodiments where the phase change layer 104 in each MLC 100$_M$ is larger than the phase change layer 104 in each SLC 100$_S$, the electrode 108 and the hard mask layer 110 in each MLC 100$_M$ may be greater in size as compared to the electrode 108 and the hard mask layer 110 in each SLC 100$_S$.

In alternative embodiments, all of the phase change layers 104 have substantially identical footprint area, which is large enough that even the larger electrodes 104 in the MLCs 100$_M$ can be fully covered by the overlying phase change layers 104, with minimum overlay issue. In these alternative embodiments, the electrodes 108 and the hard mask layers 110 covering and aligned with the phase change layers 104 in all of the cells 100 may have substantially identical footprint area as well.

A central region of an array of the memory cells 100 (including the SLCs 100$_S$ and the MLCs 100$_M$) may have lithography error less than lithography error in a peripheral region of the array. Since the MLCs 100$_M$ have larger electrodes 106 (and may also have larger phase change layers 104 and the overlying electrodes 108, hard mask layers 110) as compared to the SLCs 100$_S$, the MLCs 100$_M$ may have tolerance of lithography error greater than tolerance of lithography error in the SLCs 100$_S$. Therefore, the MLCs 100$_M$ may be arranged in the peripheral region of the array, whereas the SLCs 100$_S$ may be arranged in the central region of the array. In some embodiments, as shown in FIG. 1B, the SLCs 100$_S$ are laterally surrounded by the MLCs 100$_M$.

Referring to FIG. 1A again, the storage devices 102 may be embedded in a metallization tier over a semiconductor substrate. The metallization tier may include a dielectric layer 112 and conductive patterns 114 formed in the dielectric layer 112. The dielectric layer 112 may be further covered by an etching stop layer 116 and an overlying insulating layer 118. The electrodes 106 of the storage devices 102 may penetrate through the insulating layer 118 and the etching stop layer 116, to reach the conductive patterns 114 in the dielectric layer 112. In addition, the phase change layers 104, the top electrodes 108 (and the hard mask layers 110) may be disposed on the insulating layer 118. Although not shown, the metallization tier may further include conductive vias landing on the electrodes 108. In those embodiments where the electrodes 108 are covered by hard mask layers 110, the conductive vias may extend through the hard mask layers 110. The dielectric layer 112 may be formed of a low-k dielectric material, such as doped silicon oxide. The conductive patterns 114 may include copper. The etching stop layer 116 may be formed of silicon carbide, while the insulating layer 118 may be formed of silicon oxide.

In addition to the storage device 102, each cell 100 in the memory device 10 further includes a selector controlling access of the storage device 102. As will be further described in details, the selectors may be formed in a front-end-of-line (FEOL) structure below the metallization tiers described above, or embedded in the metallization tiers formed in a back-end-of-line (BEOL) structure.

Figure 3:
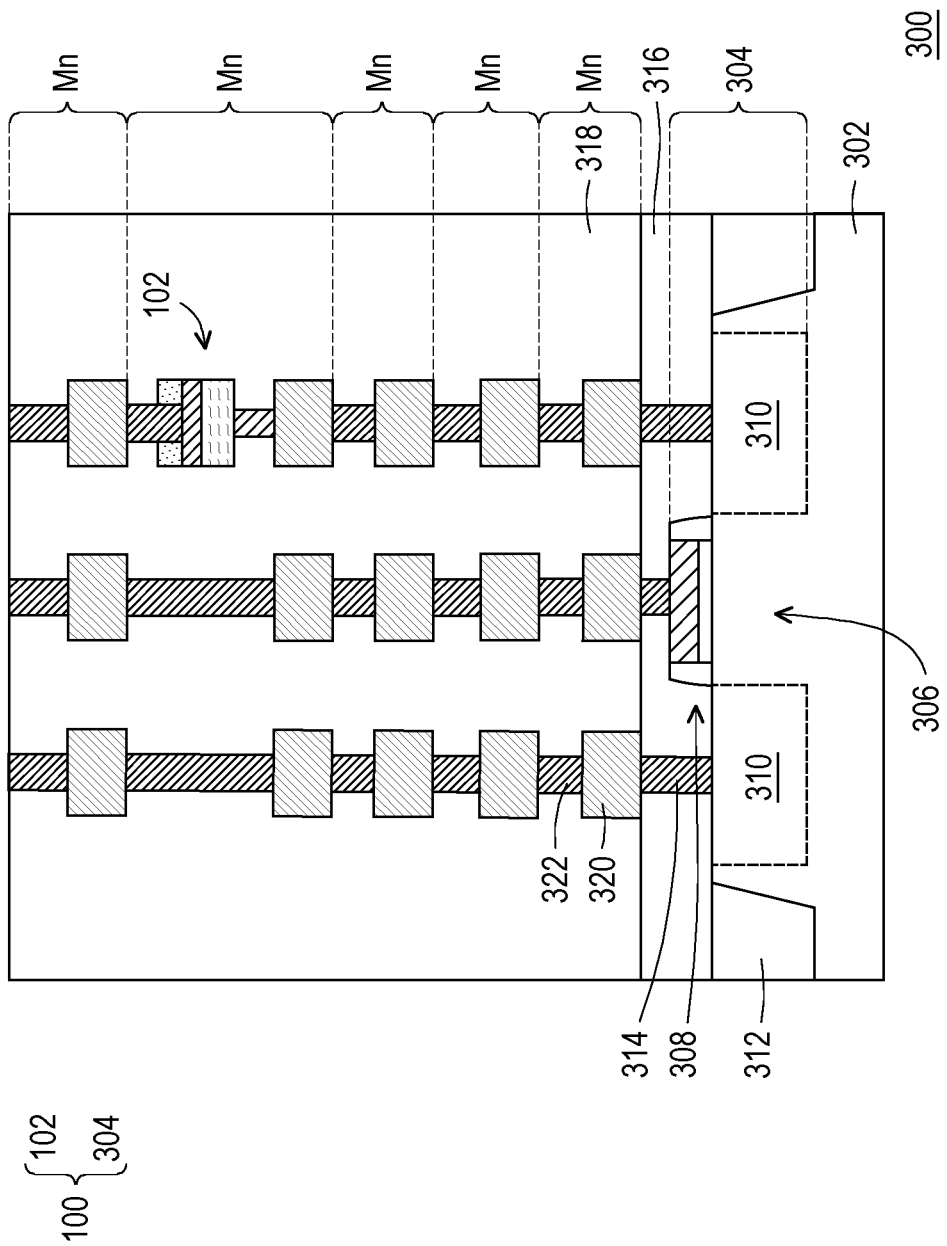
FIG. 3 is a schematic cross-sectional view illustrating a memory cell in a memory device, according some embodiments of the present disclosure.

FIG. 3 is a schematic cross-sectional view illustrating one of the memory cells 100, according some embodiments of the present disclosure.

Referring to FIG. 3, in a semiconductor die 300, a plurality of metallization tiers Mn are formed over a semiconductor substrate 302, and the storage devices 102 of the cells 100 (only a single cell 100 is shown) may be embedded in one of the metallization tiers Mn. In some embodiments, selectors 304 (only a single one is shown) controlling access of the storage devices 102 are formed on the semiconductor substrate 302, and routed to the storage devices 102 through the metallization tiers Mn lying above. In these embodiments, the selectors 304 may be metal-oxide-semiconductor field effect transistors (MOSFET) each including a channel structure 306, a gate structure 308 capacitively coupled to the channel structure 306 and a pair of source/drain structures 310 at opposite sides of the gate structure 308 and in lateral contact with the channel structure 306. In addition, the channel structure 306 may be laterally surrounded by a trench isolation structure 312. As an example shown in FIG. 3, the selectors 304 may be planar type MOSFETs. In this example, the channel structure 306 may be a planar surface portion of the semiconductor substrate 302, and the gate structure 308 is disposed on the channel structure 306. As another example (not shown), the selectors 304 may be fin-type MOSFETs, or referred to as FinFETs. In this example, the selectors 304 may each have a channel structure as a protruding fin portion of the semiconductor substrate 302, and the channel structure may be in contact with a gate structure by sidewalls and a top surface. In yet another example (also not shown), the selectors 304 may be gate-all-around (GAA) MOSFETs. In these example, the selectors 304 may respectively have a channel structure including a stack of semiconductor sheets vertically separated from one another and each wrapped around by a gate structure.

Terminals of the selectors 304 are connected to the overlying metallization tiers Mn via contact plugs 314. The gate structures of the selector 304 (e.g., a plurality of the gate structures 308) and the contact plugs 314 may be laterally surrounded by a bottom dielectric layer 316. Further, dielectric layers 318 of the metallization tiers Mn are stacked on the bottom dielectric layer 316. Conductive patterns 320 and conductive vias 322 of the metallization tiers Mn are distributed in the stack of dielectric layers 318, and provide lateral and vertical conduction paths, respectively. The storage devices 102 embedded in one of the metallization tiers Mn may be each connected to a source/drain terminal of the corresponding selector 304 (e.g., one of the source/drain structures 310) through the conductive patterns 320 and the conductive vias 322 in between. As an example, the storage devices 102 may stand on the conductive patterns 320 of the fourth bottommost metallization tier Mn, and conductive vias 322 of this metallization tier Mn may extend to the electrodes 108 of the storage devices 102 from above. In those embodiments where each storage device 102 includes the hard mask layer 110, these conductive vias 322 may penetrate through the hard mask layers 110. However, the storage devices 102 may be alternatively disposed in any of other metallization tiers Mn, the present disclosure is not limited to which level the storage device 102 is placed. In addition, the dielectric layer 112 and the insulating layers 118 as shown in FIG. 1A can be adjacent ones of the dielectric layers 318, and the etching stop layer 116 as shown in FIG. 1A is inserted between these adjacent dielectric layers 318. Moreover, the conductive patterns 114 as shown in FIG. 1A can be some of the conductive patterns 320 in one of the metallization tiers Mn.

Figure 4:
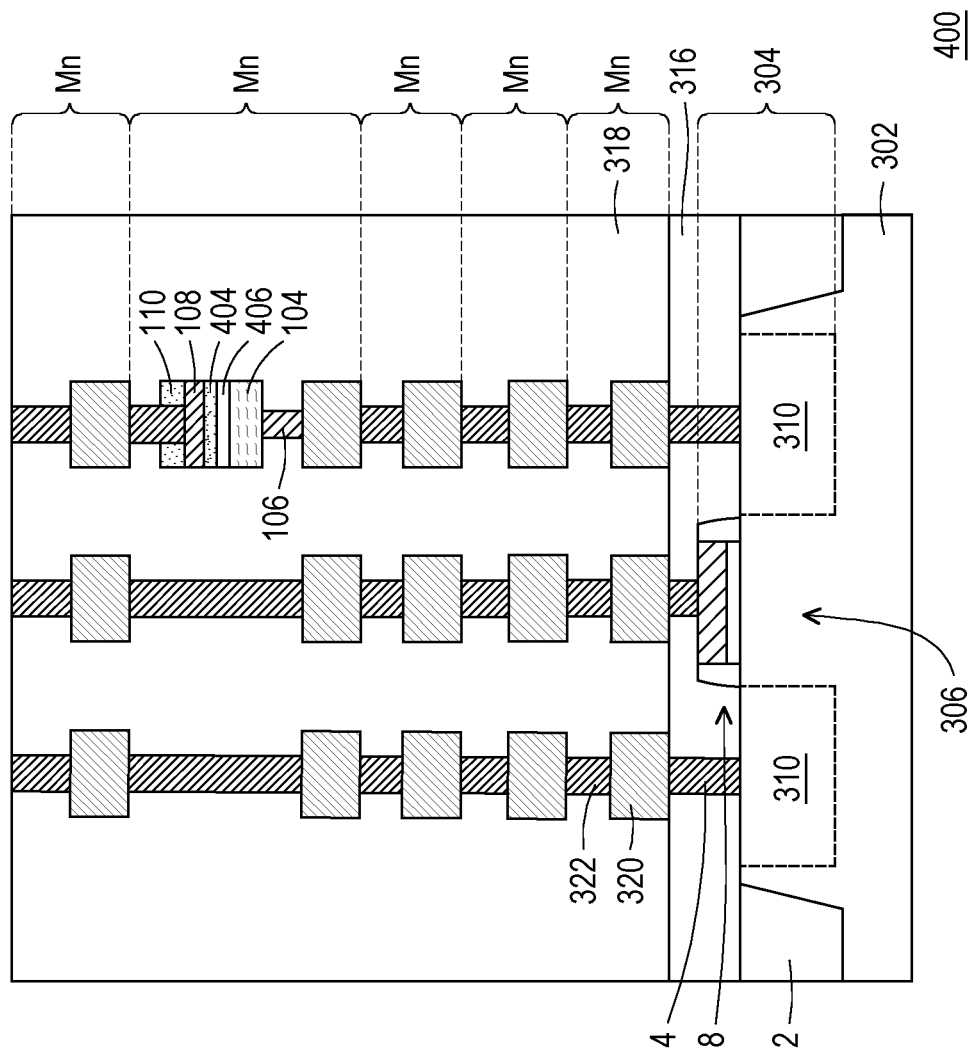
FIG. 4 is a schematic cross-sectional view illustrating that a memory cell entirely embedded in a back-end-of-line (BEOL) structure of a semiconductor die, according to some embodiments of the present disclosure.

FIG. 4 is a schematic cross-sectional view illustrating that one of the memory cells 100 is entirely embedded in a BEOL structure of a semiconductor die 400, according to some embodiments of the present disclosure.

As similar to the semiconductor die 300 shown in FIG. 3, the semiconductor die 400 shown in FIG. 4 includes a stack of metallization tiers Mn formed on a semiconductor substrate 302. As a difference from the semiconductor die 300, the semiconductor die 400 includes memory cells 100a (only a single one is shown) entirely embedded in the metallization tiers Mn. As similar to the memory cells 100 described above, the memory cells 100a respectively includes a storage device 102 having a phase change layer 104, an electrode 106 at a first side of the phase change layer 104 and configured to provide joule heating for the phase change layer 104, and an electrode 108 at a second side of the phase change layer 104. In addition, a hard mask layer 110 is optionally disposed on the electrode 108. However, selectors 402 (only a single one is shown) of the memory cells 100a are integrated into the storage devices 102, rather than being provided by transistors formed at a surface of the semiconductor substrate 302.

The selectors 402 embedded in the storage devices 102 are respectively a two-terminal switch. According to some embodiments, each selector 402 includes a switching layer 404 lying between the phase change layer 104 and the electrode 108 of the corresponding storage device 102, and share the electrodes 106, 108 with the storage device 102. A conduction path may be established through the switching layer 404 when a voltage applied across the switching layer 404 reaches a threshold voltage of the switching layer 404. On the other hand, when the voltage falls below a holding voltage of the switching layer 404, the conduction path is cut off. Therefore, the switching layer 404 between the phase change layer 104 and the electrode 108 can be functioned as a switch controlling electrical connection between the phase change layer 104 and the electrode 108. In some embodiments, a barrier layer 406 is further inserted between the phase change layer 104 and the switching layer 404, for blocking inter-diffusion between the phase change layer 104 and the switching layer 404. As an example, the switching layer 404 is formed of a chalcogenide compound. Candidates of the chalcogenide compound may contain combinations of elements including Te, Se, As, S, Sb or the like. For instance, the switching layer 116 may include GeTe, GeCTe, AsGeSe, GeSbTe, GeSiAsTe, GeSe, GeSbSe, GeSiAsSe, GeS, GeSbS, GeSiAsS, the like, or combinations thereof. Further, the barrier layer 406 may be formed of C, TaN, W, TiN, the like or combinations thereof.

In some embodiments, the phase change layer 104, the barrier layer 406, the switching layer 404, the electrode 108 and the hard mask layer 110 are stacked as a pillar structure, and the underlying electrode 106 may be laterally recessed with respect to the pillar structure. Although not shown, the conductive patterns 320 connected to top and bottom terminals of the memory cells 100a (i.e., the electrodes 106, 108) are signal lines, and the signal lines at a lower level may be intersected with the signal lines at an upper level. The memory cells 100a may be positioned at intersections of these signal lines.

Instead of being selectors of the memory cells 100a, transistors 408 (only a single one is shown) formed at a surface of the semiconductor substrate 302 may be interconnected to form a complementary-metal-oxide-semiconductor (CMOS) circuit. This CMOS circuit may be, at least in part, functioned as a driving circuit for operating the memory cells 100a. The transistors 408 are each similar to the selector 304 described with reference to FIG. 3, which can be a planar type, fin type, a GAA type or any other type of MOSFET. Identical numeral references are used for indicating identical or similar elements of the selector 304 and the transistor 408.

As described above, access of the storage devices 102 can be controlled by selectors provided by front-end transistors (e.g., MOSFETs) or back-end selectors. In other embodiments (not shown), back-end thin film transistors can be used as selectors coupled to the storage devices 102. The present disclosure is not limited to types of the selector.

Figure 5:
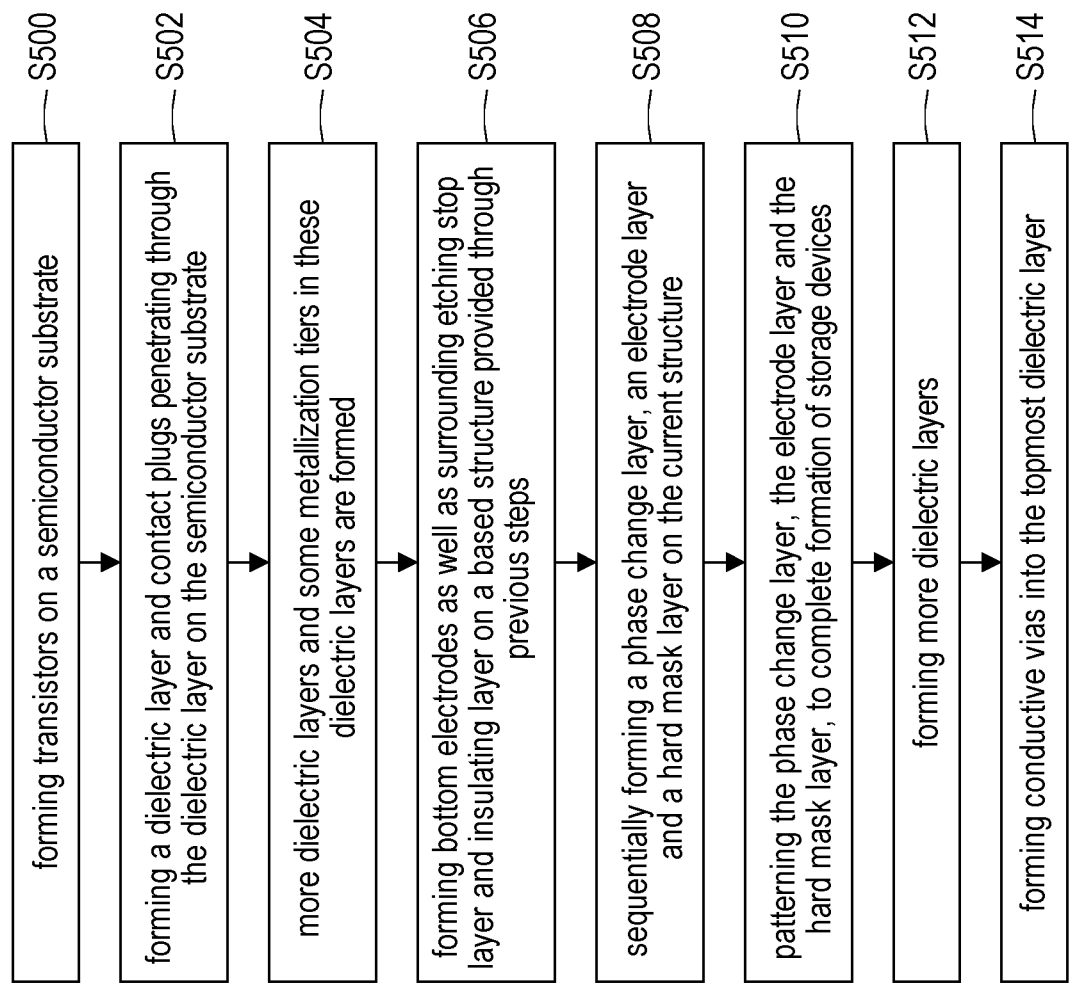
FIG. 5 is a flow diagram illustrating a method for forming the semiconductor die as shown in FIG. 3, according to some embodiments of the present disclosure.

FIG. 5 is a flow diagram illustrating a method for forming the semiconductor die 300 as shown in FIG. 3, according to some embodiments of the present disclosure. FIG. 6A through FIG. 6H are schematic cross-sectional views illustrating intermediate structures at various stages during the process as shown in FIG. 5.

Figure 6A:
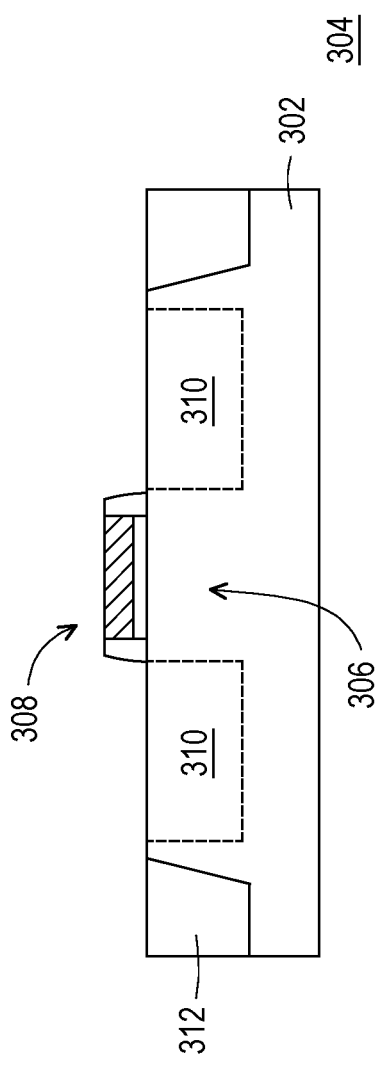

Referring to FIG. 5 and FIG. 6A, a step S500 is performed, and transistors partly provided as the selectors 304 are formed on the semiconductor substrate 302. A suitable process may be selected for forming the transistors, depending on what type of the transistors is adopted. In addition, the trench isolation structure 312 may be formed in to the semiconductor substrate 302 during formation of the transistors.

Figure 6B:
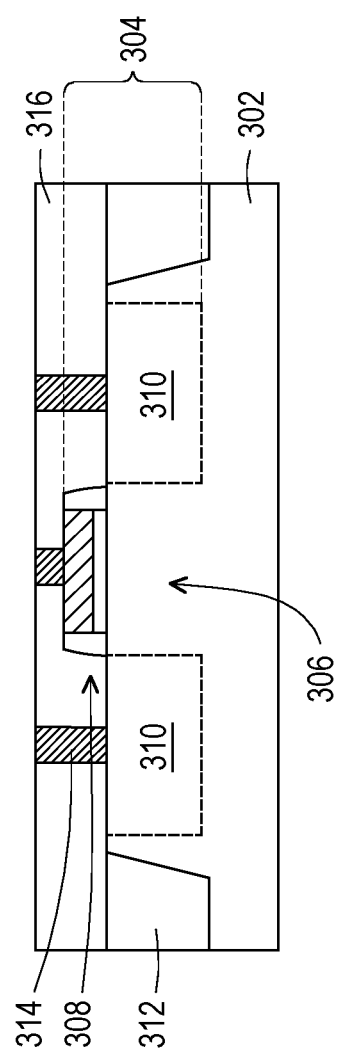

Referring to FIG. 5 and FIG. 6B, a step S502 is performed, and the dielectric layer 316 and the contact plugs 314 penetrating through the dielectric layer 316 are formed on the semiconductor substrate 302. A process up to here may be referred to as a FEOL process. The structure been formed may be referred to as a FEOL structure, and the transistors in the FEOL structure may be referred to as front-end transistors. In the following steps, a BEOL process is performed.

Figure 6C:
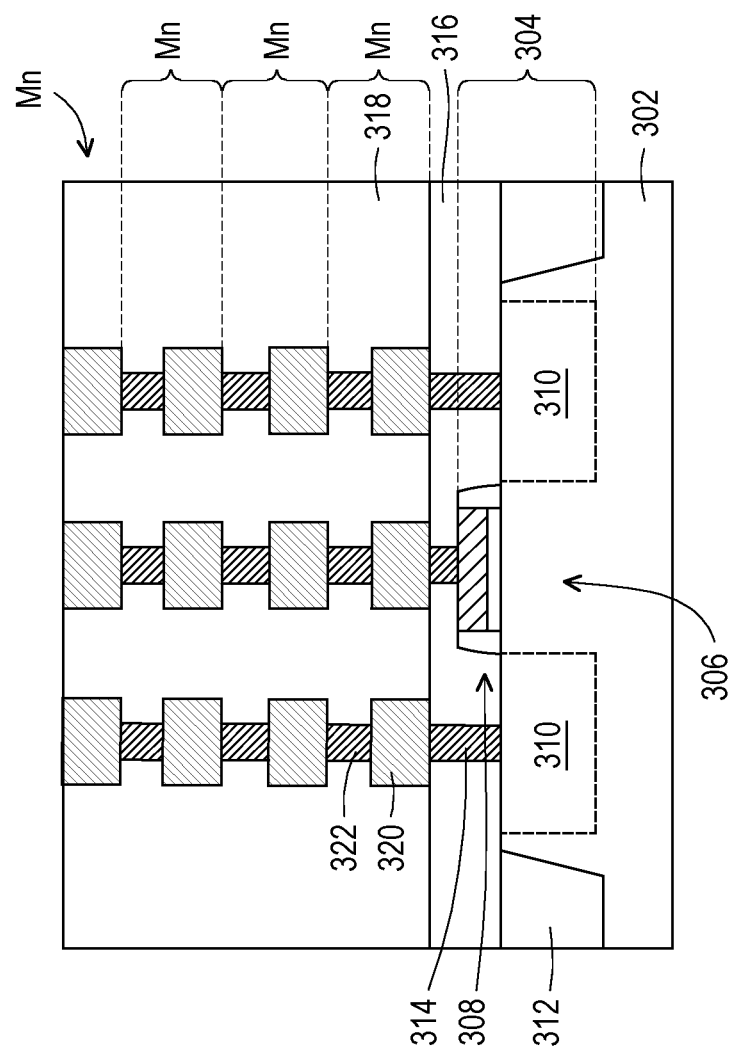

Referring to FIG. 5 and FIG. 6C, step S504 is performed, and some dielectric layers 318 as well as some metallization tiers Mn distributed in these dielectric layers 318 are formed on the FEOL structure. A topmost one of these metallization tiers Mn may be only formed in part, that the conductive patterns 320 in this metallization tier Mn are exposed. In the following steps, the storage devices 102 will be respectively formed on one of these conductive patterns 320. In some embodiments, a damascene process is repeated multiple times for forming these dielectric layers 318 and the metallization tiers Mn therein.

Figure 6D:
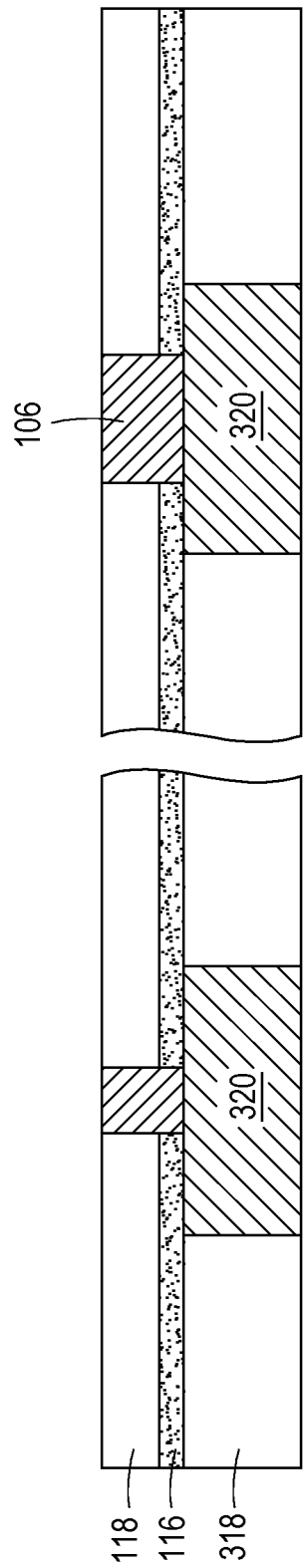

Referring to FIG. 5 and FIG. 6D, step S506 is performed, and the electrodes 106 as well as the surrounding etching stop layer 116, insulating layer 118 are formed on a base structure provided through previous steps. For conciseness, only the topmost dielectric layer 318 and the topmost conductive patterns 320 of the base structure are shown. Currently, the etching stop layer 116 and the insulating layer 118 (as another dielectric layer 318) are sequentially formed on the underlying dielectric layer 318 and conductive patterns 320. A deposition process, such as a chemical vapor deposition (CVD) process, may be used for forming each of the etching stop layer 116 and the insulating layer 118. Subsequently, openings are formed through the insulating layer 118 and the etching stop layer 116 by a lithography process and an etching process. The openings are configured to be filled by the electrodes 106, and some of the openings for accommodating the electrodes 106 in the MLCs 100$_M$ are greater in size as compared to other openings for accommodating the electrodes 106 in the SLCs 100$_S$. After formation of the openings, a conductive material is provided on the current structure by a deposition process (e.g., a CVD process or a physical vapor deposition (PVD) process, a plating process or a combination thereof, to fill up the openings. Thereafter, portions of the conductive material over the insulating layer 118 may be removed by a planarization process, such as an etching process, a polishing process or a combination thereof, and portions of the conductive material remained in the openings form the electrodes 106.

Figure 6E:
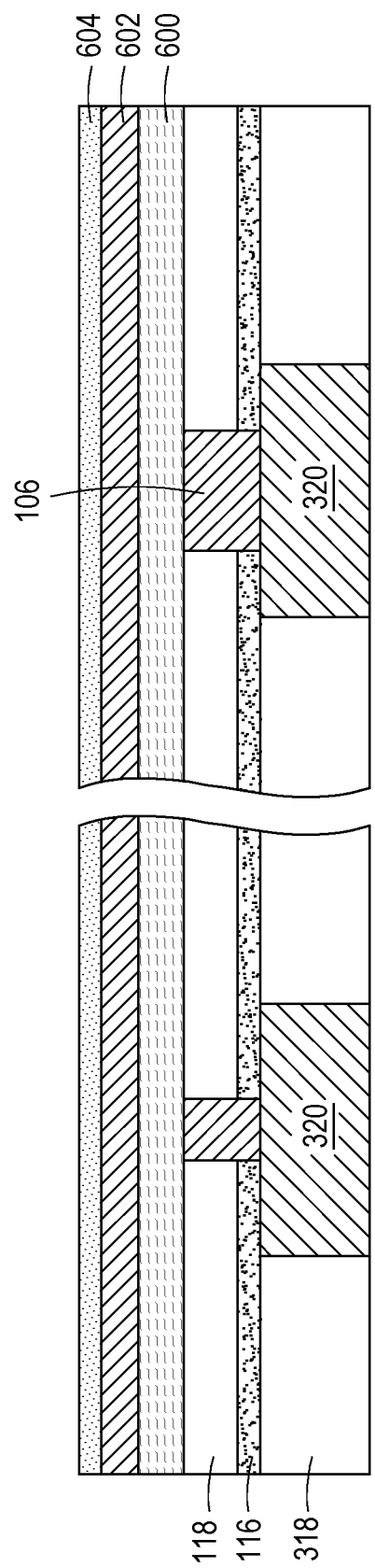

Referring to FIG. 5 and FIG. 6E, step S508 is performed, and a phase change layer 600, an electrode layer 602 and a hard mask layer 604 are sequentially formed on the current structure. The phase change layer 600 will be patterned to form the phase change layers 104 as described with reference to FIG. 1A. The electrode layer 602 will be patterned to form the electrodes 108 as described with reference to FIG. 1A, and the hard mask layer 604 will be patterned to form the hard mask layers 110 as described with reference to FIG. 1A. Currently, the phase change layer 600, the electrode layer 602 and the hard mask layer 604 entirely cover the structure as shown in FIG. 6D. A method for forming each of the phase change layer 600 and the hard mask layer 604 may include a deposition process, such as a CVD process or an atomic layer deposition (ALD) process. In addition, a method for forming the electrode layer 602 may include a deposition process (e.g., a CVD process or a PVD process), a plating process or a combination thereof.

Referring to FIG. 5 and FIG. 6F, step S510 is performed, and the phase change layer 600, the electrode layer 602 as well as the hard mask layer 604 are patterned to form the phase change layers 104, the electrodes 108 and the hard mask layers 110. A lithography process and at least one etching process may be used for patterning the phase change layer 600, the electrode layer 602 and the hard mask layer 604. Up to here, the storage devices 102, which include the storage devices $102_S$ and the storage devices $102_M$, have been formed.

Referring to FIG. 5 and FIG. 6G, step S512 is performed, and more dielectric layer(s) 318 are formed. As such, the storage devices 102 are laterally surrounded and covered by the dielectric layer(s) 318. According to some embodiments, a protection layer (not shown) may be conformally formed on the structure shown in FIG. 6F before formation of the dielectric layer(s) 318. In these embodiments, the dielectric layer(s) 318 is/are formed on this protection layer.

Figure 6H:
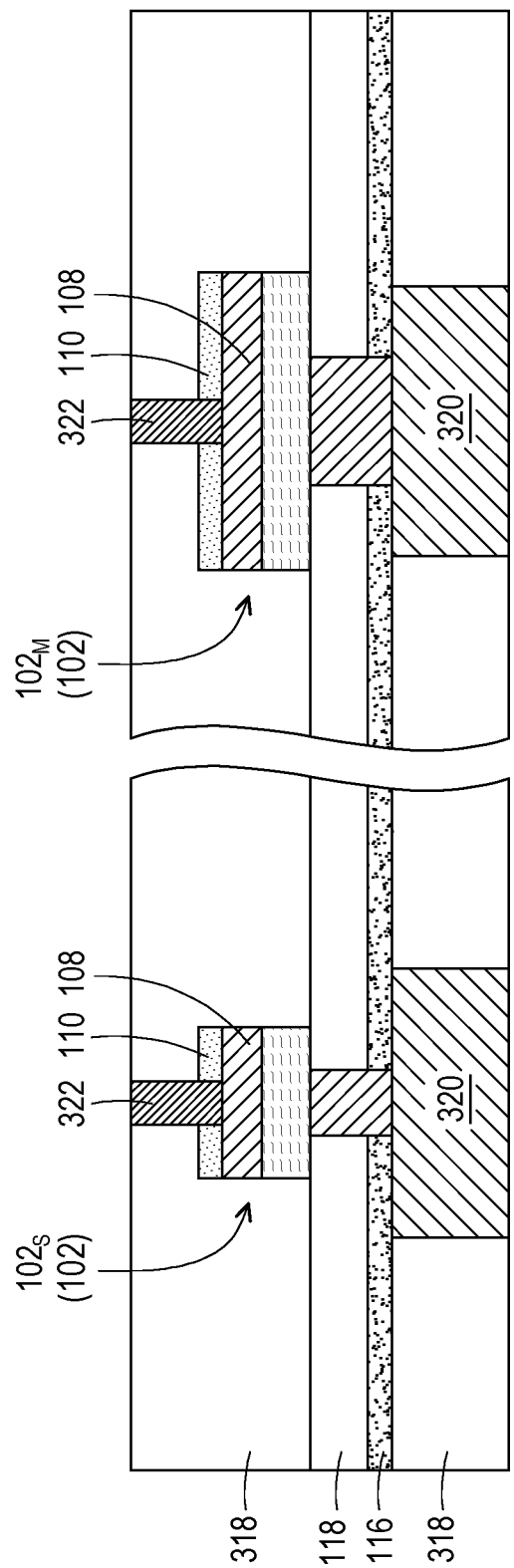

Referring to FIG. 5 and FIG. 6H, step S514 is performed, and conductive vias 322 are formed into the topmost dielectric layer 318, to complete formation of the metallization tier Mn embedded with the storage devices 102. The conductive vias 322 extend to top surfaces of the electrodes 108 of the storage devices 102. In those embodiments where the electrodes 108 are covered by the hard mask layers 110, the conductive vias 322 penetrate through the hard mask layers 110. A method for forming the conductive vias 322 may include forming openings in the topmost dielectric layer 318 (and the hard mask layers 110) by a lithography process and at least one etching process. Thereafter, a conductive material is filled into these openings by a deposition process, a plating process or a combination thereof, and a planarization process may be further performed to remove portions of the conductive material above the topmost dielectric layer 318. As a result, portions of the conductive material remained in the openings form the conductive vias 322. As examples, the planarization process may be a polishing process, an etching process or a combination thereof.

Afterward, more dielectric layers 318 and metallization tiers Mn may be further formed, to complete formation of the semiconductor die 300 as described with reference to FIG. 3.

Process for forming the semiconductor die 400 as described with reference to FIG. 4 is similar to the process described with reference to FIG. 6A through FIG. 6H, except that additional material for forming the switching layers 404 and the barrier layers 406 are inserted between the phase change layer 600 and the electrode layer 602 during the step as shown in FIG. 6E, and these material layers are patterned to form the switching layers 404 and the barrier layers 406 during the patterning step as shown in FIG. 6F.

Figure 7:
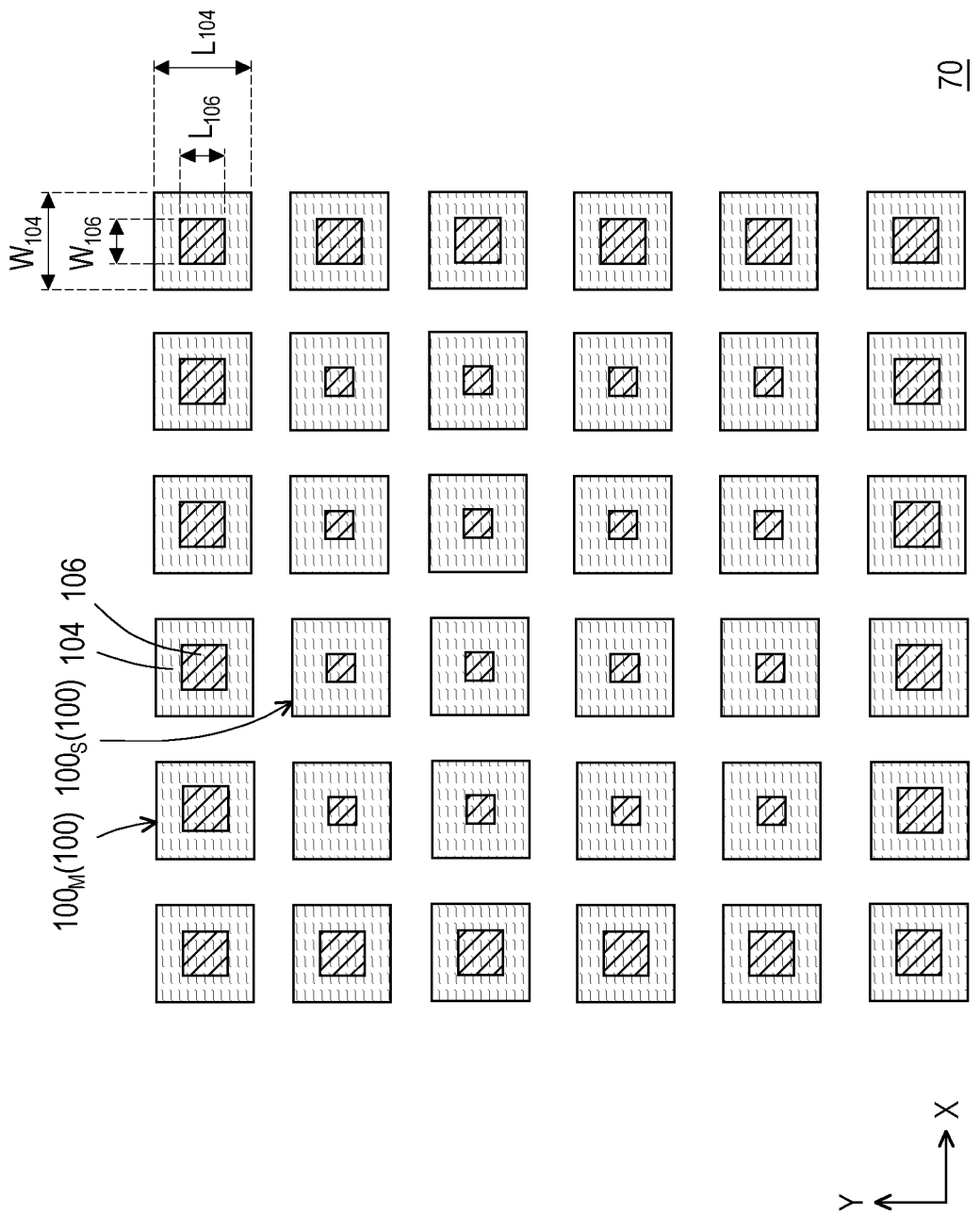
FIG. 7 is a schematic plan view illustrating phase change layers and bottom electrodes in SLCs and MLCs of a memory device, according to some embodiments of the present disclosure.

FIG. 7 is a schematic plan view illustrating the phase change layers 106 and the electrodes 106 in the SLCs $100_S$ and the MLCs $100_M$ of a memory device 70, according to some embodiments of the present disclosure. The memory device 70 is similar to the memory device as described with reference to FIG. 1A and FIG. 1B. Only differences between the memory devices 70, 10 will be described, the same or the like parts in the memory devices 70, 10 may not be repeated again.

Referring to FIG. 7, the phase change layers 104 in the SLCs $100_S$ are as large as the phase change layers 104 in the MLCs $100_M$, while the electrodes 106 in the SLCs $100_S$ are smaller in size as compared to the electrodes 106 in the MLCs $100_M$. Further, a footprint area of each phase change layer 104 should be great enough that the phase change layers 104 in the MLCs $100_M$ can fully cover the relatively large electrodes 106 lying below, and an overlay issue of the phase change layers 104 and the electrodes 106 in the MLCs $100_M$ can be minimized. By having substantially identical footprint area, the phase change layers 104 in the MLCs $100_M$ and the phase change layers 104 in the SLCs $100_S$ may have substantially identical width $W_{104}$ and substantially identical length $L_{104}$. Further, since the electrodes 108 (and the hard mask layers 110) are aligned with the phase change layers 104, the electrodes 108 (and the hard mask layers 110) in the MLCs $100_M$ may be substantially identical with the electrodes 108 (and the hard mask layers 110) in the SLCs $100_S$ in terms of footprint area, width and length.

FIG. 8A, FIG. 8B, FIG. 9A and FIG. 9B are respectively a schematic plan view illustrating the phase change layers 106 and the electrodes 106 in the SLCs $100_S$ and the MLCs $100_M$ of a memory device 80a/80b/90a/90b, according to some embodiments of the present disclosure. Differences between each of the memory devices 80a, 90a shown in FIG. 8A and FIG. 9A with respect to the memory device 10 as described with reference to FIG. 1A and FIG. 1B will be discussed, as well as differences between the memory devices 80b, 90b and the memory devices 90a. On the other hand, identical or similar parts in the memory devices 10, 80a, 80b, 90a, would not be repeated again.

Referring to FIG. 8A, according to some embodiments, the MLCs $100_M$ are arranged along columns aside an array of the SLCs $100_S$, rather than laterally surrounding the array of the SLCs $100_S$. In these embodiments, the memory cells 100 in each column of the memory device are either a column of the MLCs $100_M$ or a column of the SLCs $100_S$, rather than including a combination of some MLCs $100_M$ and some SLCs $100_S$. Therefore, bit lines (not shown) respectively connected to a column of the cells 100 can be each operated to control either a column of the MLCs $100_M$ or a column of the SLCs $100_S$. Such arrangement may facilitate memory operations.

Referring to FIG. 8B, in some embodiments, adjacent columns of the MLCs $100_M$ are laterally spaced apart by multiple columns of the SLCs $100_S$ (e.g., two columns of the SLCs $100_S$). In these embodiments, the columns of the MLCs $100_M$ may be periodically arranged among the columns of the SCLs $100_S$. Alternatively, the columns of the MLCs $100_M$ may be arranged among the columns of the SLCs $100_S$ without periodicity.

Figure 9A:
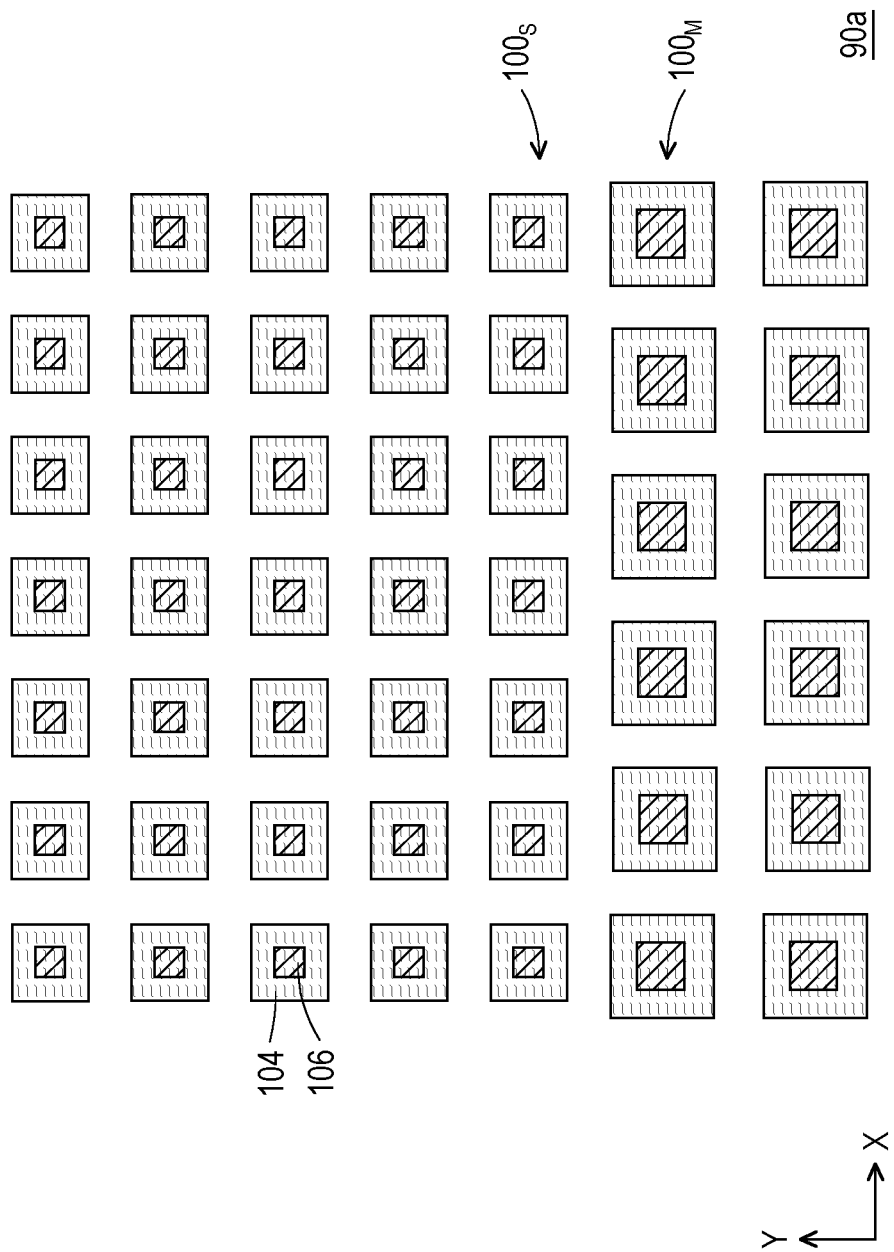

Referring to FIG. 9A, according to some embodiments, the MLCs $100_M$ are arranged along rows aside an array of the SLCs $100_S$, rather than laterally surrounding the array of the SLCs $100_S$. In these embodiments, the memory cells 100 in each row of the memory device 90a are either a row of the MLCs $100_M$ or a row of the SLCs $100_S$, rather than including a combination of some MLCs $100_M$ and some SLCs $100_S$.

Therefore, word lines (not shown) respectively connected to a row of the cells 100 can be each operated to control either a row of the MLCs $100_M$ or a row of the SLCs $100_S$. Such arrangement may facilitate memory operations as well.

Figure 9B:
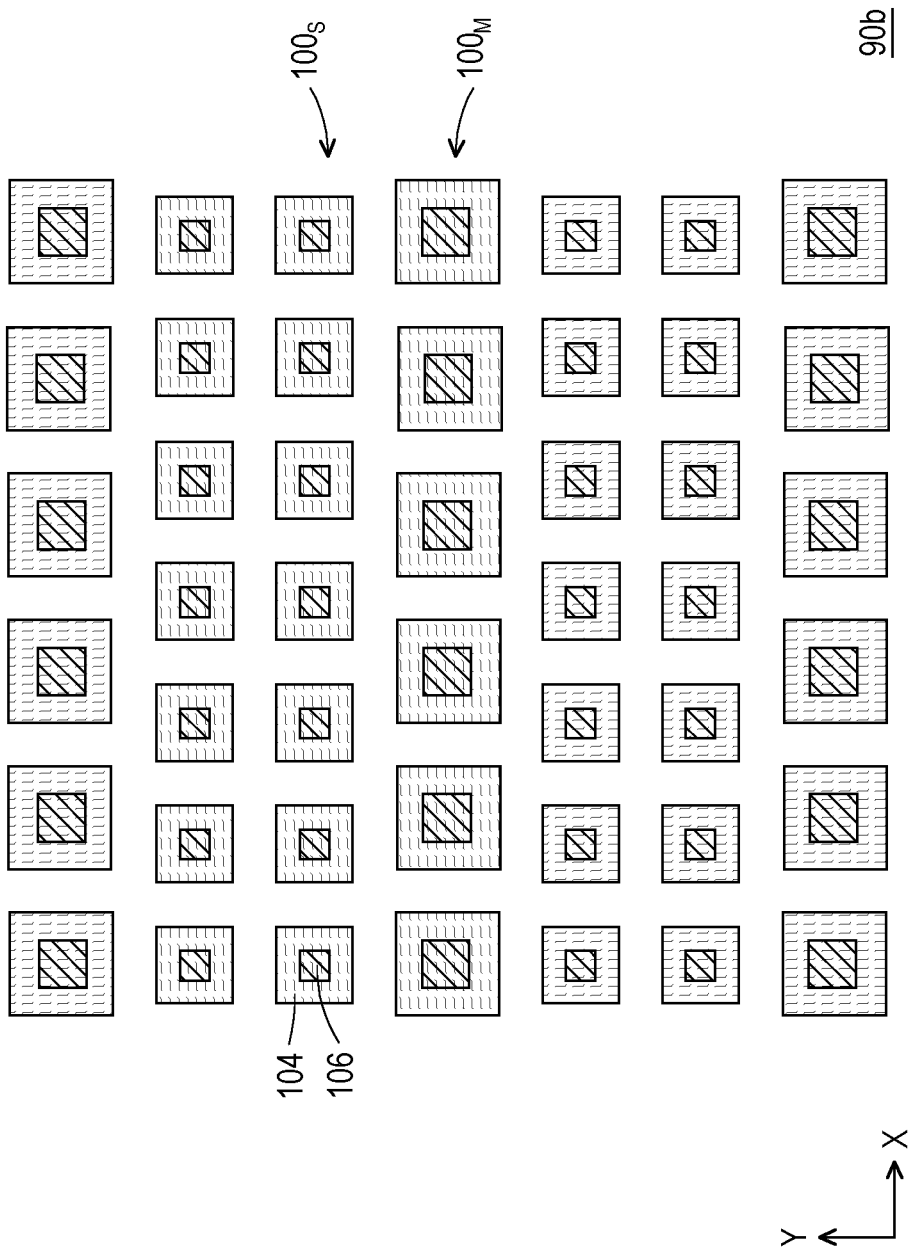

Referring to FIG. 9B, in some embodiments, adjacent rows of the MLCs $100_M$ are laterally spaced apart by multiple rows of the SLCs $100_S$ (e.g., two rows of the SLCs $100_S$). In these embodiments, the rows of the MLCs $100_M$ may be periodically arranged among the rows of the SCLs $100_S$. Alternatively, the rows of the MLCs $100_M$ may be arranged among the rows of the SLCs $100_S$ without periodicity.

As shown in FIG. 8A, FIG. 8B, FIG. 9A and FIG. 9B, the phase change layers 104 (and also the electrodes 108 and the hard mask layers 110) in the MLCs $100_M$ are larger in size as compared to the phase change layers 104 (and also the electrodes 108 and the hard mask layers 110) in the SLCs $100_S$. Alternatively, as similar to the embodiments shown in FIG. 7, the phase change layers 104 (and also the electrodes 108 and the hard mask layers 110) in the SLCs $100_S$ may be as large as the phase change layers 104 (and also the electrodes 108 and the hard mask layers 110) in the MLCs $100_M$.

As above, the provided memory device includes a memory array including SLCs and MLCs. As having the MLCs, the memory device can be benefited from high memory density. On the other hand, as having the SLCs, the memory device is available for storing data with low fault tolerance. Further, the SLCs and the MLCs are different in terms of dimensions, such that power for programming the SLCs can be reduced, and data can be more accurately stored in the MLCs.

In an aspect of the present disclosure, a memory device is provided. The memory device comprises: first memory cells, respectively configured to store a single bit of information; and second memory cells, respectively capable of storing multiple bits of information, wherein each of the first memory cells and the second memory cells comprises: a phase change layer; and a first electrode, in contact with a first side of the phase change layer, and configured to provide joule heat to the phase change layer during a programming operation, wherein the first electrode in each of the second memory cells is greater in footprint area as compared to the first electrode in each of the first memory cells.

In another aspect of the present disclosure, a memory device is provided. The memory device comprises: first memory cells, respectively configured to store a single bit of information; and second memory cells, respectively capable of storing multiple bits of information, wherein each of the first memory cells and the second memory cells comprises: a selector; and a storage device, coupled to the selector, and comprising a phase change layer as well as a first electrode and a second electrode at opposite sides of the phase change layer, wherein the first electrode is configured to provide joule heat to the phase change layer during a programming operation, and the first electrode in each of the second memory cells is greater in footprint area as compared to the first electrode in each of the first memory cells.

In yet another aspect of the present disclosure, a semiconductor die is provided. The semiconductor die comprises: transistors, formed on a semiconductor substrate; metallization tiers, formed over the semiconductor substrate; and storage devices, embedded in at least one of the metallization tiers, wherein a first group of the storage devices are each configured to store a single bit of information, a second group of the storage devices are each capable of storing multiple bits of information, and each of the storage devices comprises: a phase change layer; and a first electrode and a second electrode, at opposite sides of the phase change layer, wherein the first electrode is configured to provide joule heat to the phase change layer during a programming operation, wherein the first electrode in each of the second group of the storage devices is greater in footprint area as compared to the first electrode in each of the first group of the storage devices.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   first memory cells, respectively configured to store a single bit of information; and
   second memory cells, respectively capable of storing multiple bits of information, wherein each of the first memory cells and the second memory cells comprises:
   a phase change layer; and
   a first electrode, in contact with a first side of the phase change layer, and configured to provide joule heat to the phase change layer during a programming operation, wherein the first electrode in each of the second memory cells is greater in footprint area as compared to the first electrode in each of the first memory cells.

2. The memory device according to claim 1, wherein the phase change layer in each of the second memory cells is greater in footprint area as compared to the phase change layer in each of the first memory cells.

3. The memory device according to claim 1, wherein the phase change layer in each of the second memory cells is substantially identical in footprint area as compared to the phase change layer in each of the first memory cells.

4. The memory device according to claim 1, wherein the first electrode is laterally recessed with respect to the phase change layer in each of the first memory cells and the second memory cells.

5. The memory device according to claim 1, wherein each of the first memory cells and the second memory cells further comprises a second electrode at a second side of the phase change layer.

6. The memory device according to claim 5, wherein sidewalls of the second electrode and the phase change layer in each of the first memory cells and the second memory cells are substantially coplanar.

7. The memory device according to claim 5, wherein each of the first memory cells and the second memory cells further comprises a hard mask layer covering the second electrode, and sidewalls of the hard mask layer, the second electrode and the phase change layer in each of the first memory cells and the second memory cells are substantially coplanar.

8. The memory device according to claim 1, wherein the first memory cells are laterally surrounded by the second memory cells.

9. The memory device according to claim 1, wherein the second memory cells are arranged along columns aside columns of the first memory cells.

10. The memory device according to claim 1, wherein adjacent columns of the second memory cells are laterally spaced apart by at least one column of the first memory cells.

11. The memory device according to claim 1, wherein the second memory cells are arranged along rows aside rows of the first memory cells.

12. The memory device according to claim 1, wherein adjacent rows of the second memory cells are laterally spaced apart by at least one row of the first memory cells.

13. A memory device, comprising:
first memory cells, respectively configured to store a single bit of information; and
second memory cells, respectively capable of storing multiple bits of information, wherein each of the first memory cells and the second memory cells comprises:
a selector; and
a storage device, coupled to the selector, and comprising a phase change layer as well as a first electrode and a second electrode at opposite sides of the phase change layer, wherein the first electrode is configured to provide joule heat to the phase change layer during a programming operation, and the first electrode in each of the second memory cells is greater in footprint area as compared to the first electrode in each of the first memory cells.

14. The memory device according to claim 13, wherein the selector is a transistor formed at a surface of a semiconductor substrate, and the storage device is elevated from the semiconductor substrate.

15. The memory device according to claim 13, wherein the selector is integrated into the storage device.

16. The memory device according to claim 15, wherein the selector comprises a switching layer lying between the phase change layer and the second electrode of the storage device.

17. The memory device according to claim 16, wherein a barrier layer extends in between the switching layer and the phase change layer.

18. A semiconductor die, comprising:
transistors, formed on a semiconductor substrate;
metallization tiers, formed over the semiconductor substrate; and
storage devices, embedded in at least one of the metallization tiers, wherein a first group of the storage devices are each configured to store a single bit of information, a second group of the storage devices are each capable of storing multiple bits of information, and each of the storage devices comprises:
a phase change layer; and
a first electrode and a second electrode, at opposite sides of the phase change layer, wherein the first electrode is configured to provide joule heat to the phase change layer during a programming operation, wherein the first electrode in each of the second group of the storage devices is greater in footprint area as compared to the first electrode in each of the first group of the storage devices.

19. The semiconductor die according to claim 18, wherein at least a group of the transistors are selectors configured to control access of the storage devices.

20. The semiconductor die according to claim 18, further comprising selectors coupled to the storage devices and also embedded in the at least one of the metallization tiers.

* * * * *